(12) United States Patent
Matikkala et al.

(10) Patent No.: US 10,942,284 B2
(45) Date of Patent: Mar. 9, 2021

(54) RADIATION DETECTOR PANEL ASSEMBLY STRUCTURE

(71) Applicant: DETECTION TECHNOLOGY OY, Oulu (FI)

(72) Inventors: Mikko Matikkala, Oulu (FI); Arsi Stång, Oulu (FI)

(73) Assignee: DETECTION TECHNOLOGY OY, Oulu (FI)

( * ) Notice: Subject to any disclaimer, the term of this patent is extended or adjusted under 35 U.S.C. 154(b) by 0 days.

(21) Appl. No.: 16/481,138

(22) PCT Filed: Jan. 25, 2018

(86) PCT No.: PCT/EP2018/051769
§ 371 (c)(1),
(2) Date: Jul. 26, 2019

(87) PCT Pub. No.: WO2018/138178
PCT Pub. Date: Aug. 2, 2018

(65) Prior Publication Data
US 2019/0361135 A1    Nov. 28, 2019

(30) Foreign Application Priority Data

Jan. 27, 2017 (EP) ...................................... 17153479

(51) Int. Cl.
*G01T 1/24* (2006.01)
*H01L 27/146* (2006.01)
*H01L 31/024* (2014.01)

(52) U.S. Cl.
CPC .......... *G01T 1/24* (2013.01); *H01L 27/14618* (2013.01); *H01L 27/14676* (2013.01); *H01L 27/14696* (2013.01); *H01L 31/024* (2013.01)

(58) Field of Classification Search
None
See application file for complete search history.

(56) References Cited

U.S. PATENT DOCUMENTS

| 2004/0262497 | A1* | 12/2004 | Tokuda | ................. H01L 31/115 250/214.1 |
| 2005/0167605 | A1* | 8/2005 | Juni | .......................... G01T 1/20 250/370.11 |

(Continued)

OTHER PUBLICATIONS

International Search Report and Written Opinion for Application No. PCT/EP2018/051769 dated Apr. 13, 2018, 9 pages.

(Continued)

*Primary Examiner* — J. E. Schoenholtz
(74) *Attorney, Agent, or Firm* — Alston & Bird LLP

(57) ABSTRACT

According to an embodiment, a method comprises: configuring a panel plate as an entrance window for high energy electromagnetic, for example x-ray or gamma ray, radiation; attaching a bias plate on the panel plate, wherein the bias plate is configured to conduct electricity and pass the radiation through it; and attaching an array of tiles, where in each tiles comprises a direct conversion compound semiconductor sensor and a readout integrated circuit, IC, layer on the bias plate so that the direct conversion compound semiconductor sensor is configured on the bias plate; wherein the direct conversion compound semiconductor sensor is configured to convert photons of the high energy electromagnetic, for example x-ray or gamma ray, radiation into an electric current; and wherein the readout IC layer is situated next to the direct conversion compound semiconductor sensor and configured to receive the electric current and process the electric current. Other embodiments relate to a detector comprising an array of assemblies, and an imaging system comprising: an x-ray source and the detector.

8 Claims, 14 Drawing Sheets

(56) References Cited

U.S. PATENT DOCUMENTS

| | | | |
|---|---|---|---|
| 2006/0192087 A1* | 8/2006 | Kuszpet | G01T 1/247 |
| | | | 250/214 R |
| 2007/0075251 A1* | 4/2007 | Doughty | G01T 1/026 |
| | | | 250/370.01 |
| 2008/0093560 A1* | 4/2008 | Puhakka | H01L 27/14634 |
| | | | 250/370.08 |
| 2010/0327173 A1 | 12/2010 | Woychik et al. | |
| 2015/0228685 A1 | 8/2015 | Uchida et al. | |

OTHER PUBLICATIONS

Extended European Search Report for Application No. EP 17153479.5 dated Jul. 24, 2017, 7 pages.
International Preliminary Report on Patentability (Chapter II) for Application PCT/EP2018/051769 dated Apr. 15, 2019, 6 pages.

* cited by examiner

RADIATION DETECTOR PANEL ASSEMBLY STRUCTURE

CROSS-REFERENCE TO RELATED APPLICATIONS

This application is a national phase entry of International Application No. PCT/EP2018/051769, filed Jan. 25, 2018, which claims priority to European Patent Application No. 17153479.5, filed on Jan. 27, 2017, the entire contents of which are incorporated herein by reference.

BACKGROUND

Direct conversion compound semiconductor based detectors and detector arrays are utilized in radiation imaging in order to convert for example x-ray or gamma ray photons directly into electric charges. They are typically comprised of an x-ray photoconductor layer grown directly on top of a charge collector and a readout layer (such as room temperature semi-conductors). The detectors are commonly utilized in arrays of multiple tiles such that an increased image size with improved resolution may be generated. Large area x-ray or gamma radiation detectors are made of an array of smaller sensor tiles.

The performance of the detectors can be important to many imaging applications. For many applications, the imaging requirements can be very stringent. Vertical stacking of the tiles having a direct conversion compound semiconductor layer, an integrated circuit, IC, layer and a substrate layer may present some problematic conditions. For example, the heat generated by the IC can couple to the semiconductor detector and introduce unwanted noise and thermal variation. For example, for optimal performance, the operation temperature of the semiconductor detector should be kept around 20-30 degrees Celsius, so that the heat generated by the IC should be conducted away. Further, the top side of the semiconductor layer needs to be electrically connected to high bias voltage, for example even up to 1000 V.

Publication D1 discloses information that may be regarded as useful for understanding the background.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide a radiation detector panel assembly structure. The object is achieved by the features of the independent claims. Some embodiments are described in the dependent claims. According to an embodiment, a method comprises: configuring a panel plate as an entrance window for high energy electromagnetic radiation; attaching a bias plate on the panel plate, wherein the bias plate is configured to conduct electricity and pass the radiation through it; and attaching an array of assemblies comprising a direct conversion compound semiconductor sensor and a readout integrated circuit, IC, layer on the bias plate so that the direct conversion compound semiconductor sensor is configured on the bias plate; wherein the direct conversion compound semiconductor sensor is configured to convert photons of the high energy electromagnetic radiation into an electric current; and wherein the readout IC layer is situated next to the direct conversion compound semiconductor sensor and configured to receive the electric current and process the electric current.

Other embodiments relate to a detector comprising an array of assemblies, and an imaging system comprising: an x-ray source and the detector.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

According to an embodiment, layers of a direct conversion compound semiconductor sensor, a readout integrated circuit (IC) and, optionally a substrate, establish a tile. An x-ray detector has an array of tiles. The tiles are attached directly on a bias plate of a radiation entrance window which receives the high energy radiation. The direct conversion compound semiconductor sensor faces and contacts the bias plate, and rests on the bias plate during the manufacturing process. The bias plate may conduct both heat and electricity to enable the operation of the sensor. The sub-assembly of the detector is further processed. The processing of the sub-assembly is started form the top part and continued to the bottom parts. Once the sub-assembly is complete, it is turned over to be used as the detector in the manufacturing process. Consequently, the sensor of the tile may be attached on the bias plate of the entrance window, and the manufacturing process may be continued until the complete sub-assembly is turned over for being further applied as a detector.

According to an embodiment, the manufacturing process of the sub-panel assembly of the detector may avoid planarity issues when assembling the sensor tiles into the sub-panel assembly. For example, height difference of the tiles within the panel may be extremely small, because the sensor is attached onto the bias plate directly. The structure of the sub-assembly of the detector may eliminate the use of a separated substrate for the tile assembly, thus improving thermal load transfer from the readout IC. The structure of the sub-assembly may further eliminate the use of a separated substrate for the tile assembly, thus greatly reducing the bill of cost of the sub-assembly. Furthermore, the structure of the sub-assembly may provide a high-voltage bias (HV bias) to the top side of the sensor tiles. The structure of the sub-assembly may also isolate thermal leakage from outside to the top of the sensor tiles, and it may improve thermal conductivity. Furthermore, the structure may isolate the HV bias from outside and improve safety of the detector.

Although the embodiments may be described and illustrated herein as being implemented in a direct conversion compound semiconductor, this is only an example implementation and not a limitation. As those skilled in the art will appreciate, the present embodiments are suitable for application in a variety of different types of detector semiconductor crystals such as Cadmium Telluride (CdTe), Cadmium Zinc Telluride CdZnTe, etc.

Figure 1:
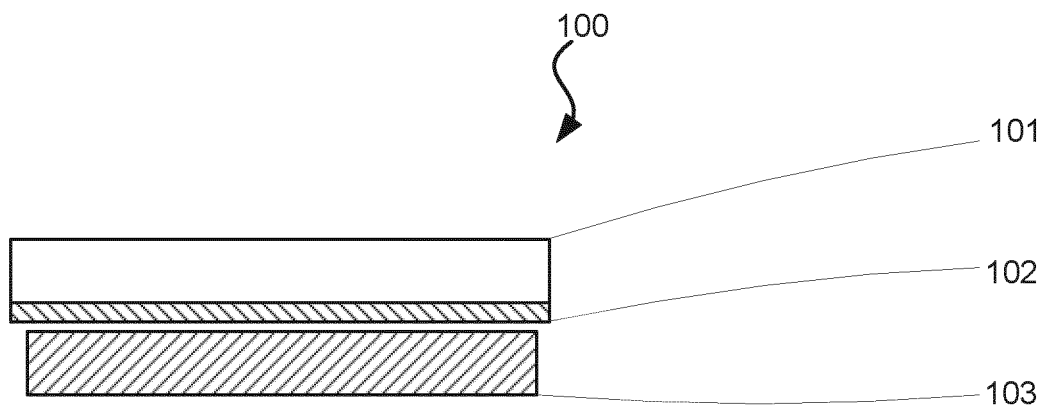
FIG. 1 illustrates a schematic representation of a cross section side view of a tile showing a direct conversion compound semiconductor sensor, a readout integrated circuit, and a substrate according to an embodiment.

FIG. 1 illustrates a schematic representation of a cross section side view of a tile 100 in a z-axis (not shown in FIG. 1) direction showing a direct conversion compound semiconductor sensor 101, a readout integrated circuit (IC) 102, and a tile substrate 103 according to an embodiment.

The direct conversion compound semiconductor sensor 101 may also be referred to as a sensor chip. It is configured to convert high energy, such as x-ray or gamma ray, photons into corresponding electronic currents that may be detected. The sensor 101 is the uppermost layer of the tile 100. The compound semiconductor sensor 101 receives x-ray radiation. It should be noted that instead of x-rays, gamma ray radiation may be received. The sensor chip 101 has a number of detector elements (not shown in FIG. 1), each detector element being connected to the readout IC 102 from the bottom side. The detector elements are having a common bias structure on top of the sensor chip (not shown in FIG. 1). The sensor chip 101 may require a high-voltage (HV) bias to be electrically connected to a top side of the sensor chip 101.

Under the sensor 101, there is a readout IC 102. The readout IC 102 may be an application-specific integrated circuit (ASIC). The ASIC may include microprocessors, memory blocks including ROM, RAM, EEPROM, flash memory and other large building blocks. This kind of ASIC is often termed a SoC (system-on-chip). It may be configured using a hardware description language (HDL), such as Verilog or VHDL, to describe the functionality of ASICs. Instead of an ASIC, Field-programmable gate arrays (FPGA) may be used as programmable logic blocks and programmable interconnects allowing the same FPGA to be used in many different applications. The readout IC 102 reads the electrical signal from each of the detector elements of the sensor chip 101. The readout IC 102 multiplexes the detector element signal into a smaller number of I/O (input/output) located at the bottom side of the readout IC 102.

The lowermost layer is the substrate 103. The substrate 103 supports the sensor chip 101 and readout IC 102. The substrate (also referred to as a wafer) may be a solid (usually planar) substance onto which a layer of another substance is applied and to which that second substance adheres. The substrate 103 can be made from organic or inorganic material. For example, the substrate 103 may be a slice of material such as ceramic or FR4. These serve as the foundation upon which the IC electronic devices such as transistors, diodes, and especially integrated circuits (ICs) are deposited.

Figure 2:
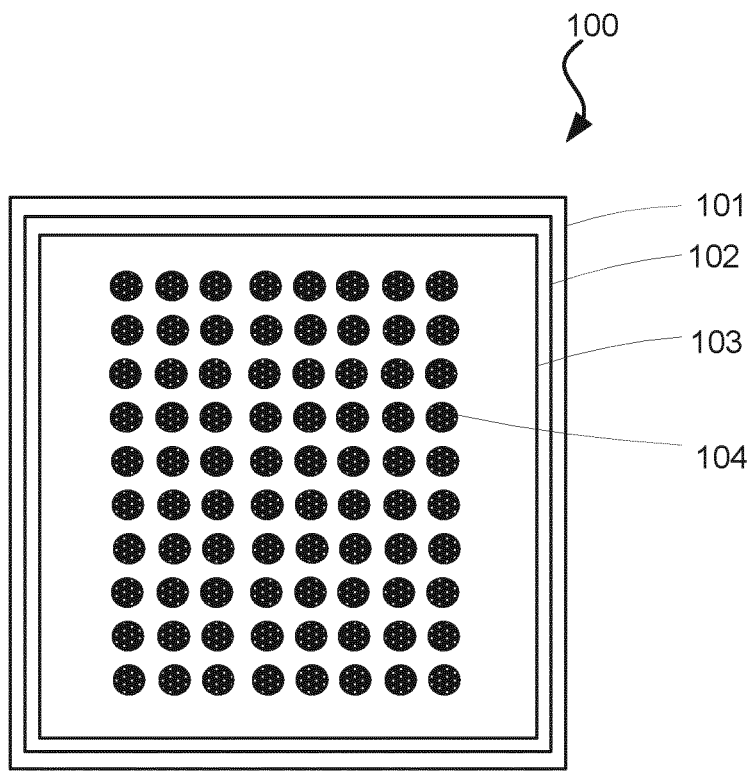
FIG. 2 illustrates a schematic representation of a bottom view of the tile according to an embodiment.

FIG. 2 illustrates a schematic representation of a bottom view of the tile 100 according to an embodiment. Input and/or output (I/O) connection pads 104 are shown at the bottom of the substrate 103. I/O of the readout IC 102 can be routed from the top side of the substrate 103 to the bottom side of the substrate 103 via the connection pads 104.

The sensor 101, the IC 102 and the substrate 103 establish the tile 100. One tile has an array of pixels, and each pixel corresponds to a signal pad on the compound semiconductor in digital imaging in the detector. The detector has an array (alternatively referred to as a matrix) of tiles 100.

Figure 3:
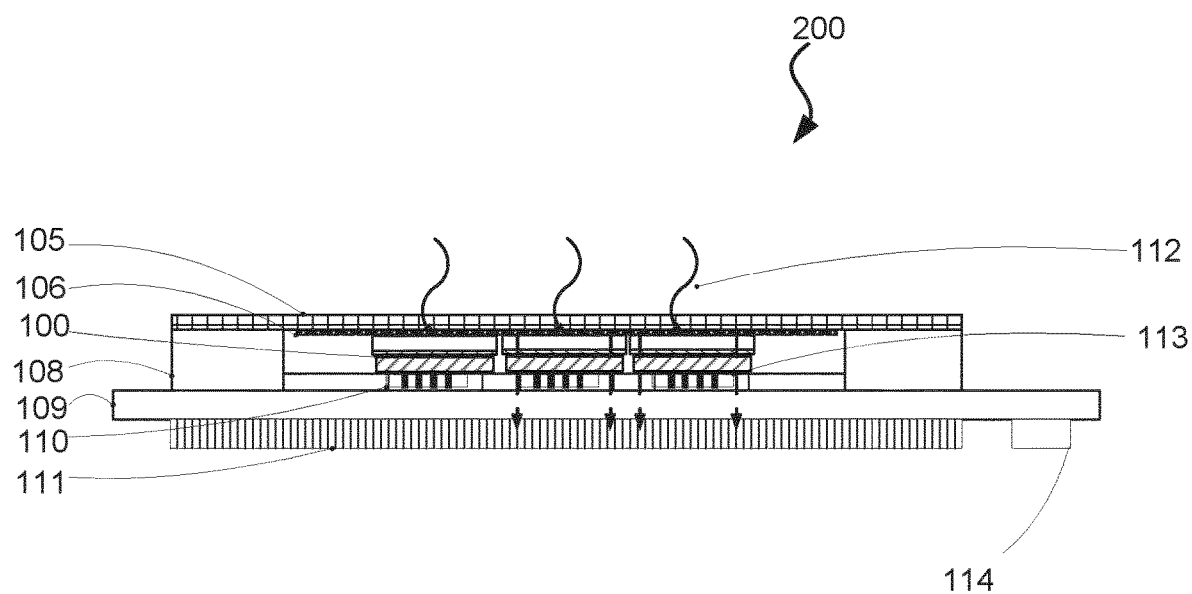
FIG. 3 illustrates a schematic representation of a cross section side view of a sub-assembly of a detector according to an embodiment.

FIG. 3 illustrates a schematic representation of a cross section side view of a panel sub-assembly 200 of a detector according to an embodiment. The panel sub-assembly 200 comprises a radiation entrance window 105, a bias plate 106, the sensor tile 100, a tile support plate 108, an interconnection board 109, and a panel support plate 111. High energy radiation 112 enters into the sub-assembly 200.

The radiation entrance window 105 may be made from x-ray or gamma ray radiation transparent material. This material may also be electrically and thermally isolating material, for example glass. The bias plate 106 may be made from thin x-ray or gamma ray transparent material. It may also be electrically conductive material, for example aluminum. The sensor tile 100 has been described for example with reference to FIGS. 1 and 2. Heat transfer 113 is shown under the substrate 103. It conducts heat from the tile 100 towards the interconnection board 109. The tile support plate 108 is configured to secure the sensor tile array. The interconnection board 109 is configured with spring load connectors 110. The sensor tile input and/or output, for example the I/O connection pads 104, are contacted by the spring load connectors 110, and a signal can be routed in the interconnection board 109 to an output connector 114. The panel support plate 111 may be configured as a heat sink for the sub-assembly 200. Furthermore, it secures the sub-assembly 200. The panel support plate 111 is made from highly heat conductive material to allow heat transfer from the sensor tile 100 and the interconnection board 109.

Figure 4:
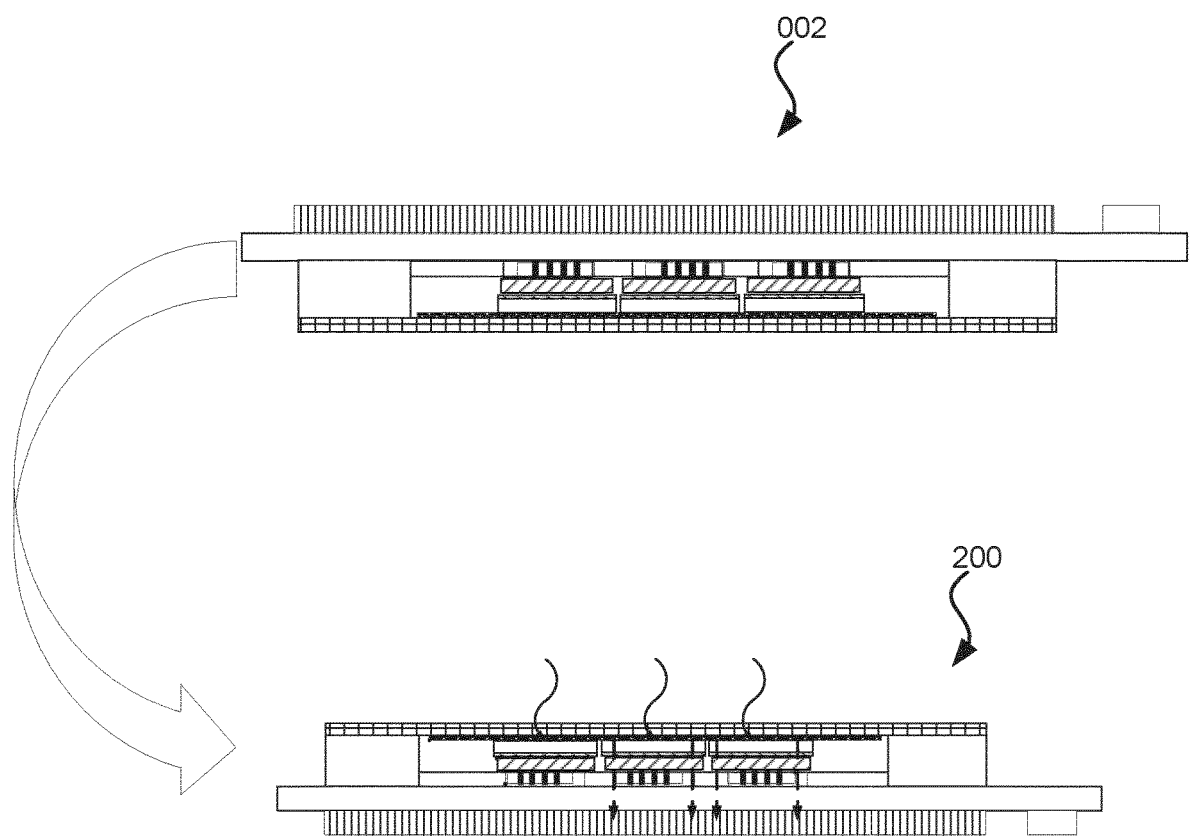
FIG. 4 illustrates a schematic representation of a cross section side view of a sub-assembly of a detector, wherein the sub assembly is flipped upside down to be configured as the detector according to an embodiment.

FIG. 4 illustrates a schematic representation of a cross section side view of a sub-assembly 200 of a detector, wherein the sub assembly 200 is flipped upside down to be configured as the detector according to an embodiment. A manufacturing process of the sub-assembly 200 is started from a top part, then continuing to bottom parts. This is illustrated by reference 002 in FIG. 4, wherein the sub-assembly is upside down. The manufacturing process is operated accordingly so that the tiles 100 may be configured conveniently and with a very small height difference between different tiles 200 onto the bias plate 106. Once the sub-assembly 200 is completed in the manufacturing process, the sub-assembly 200 is flipped for final usage in the detector as shown in the lowest part of FIG. 4. When the sub-assembly is upside down 002, it is convenient to assemble, and the final product 200 for the detector may be turned into an appropriate use position. In the position 002 of the upper part of FIG. 4, the sub-assembly is upside down with respect to the z-axis (not shown in FIG. 4), so that the radiation entrance window 105 is the lowest part and the panel support plate 111 is the top part.

Figure 5:
FIG. 5 illustrates a schematic representation of a cross section side view of a panel plate preparation in a manufacturing process according to an embodiment.

FIG. 5 illustrates a schematic representation of a cross section side view of a panel plate preparation of a manufacturing process according to an embodiment. The process may start by configuring the bias plate 106 onto the radiation entrance window 105. The window 105 may rest on a general assembly plane (not shown in FIG. 5), which is only used for the manufacturing process, and the bias plate 106 is attached onto the window 105.

Figure 6:
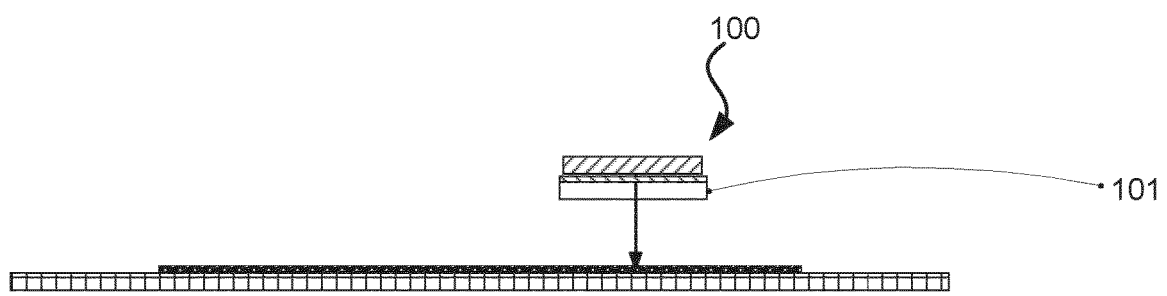
FIGS. 6, 7, 8 illustrate a schematic representation of a cross section side view of a manufacturing process for attaching tiles to a bias plate according to an embodiment.
Figure 7:
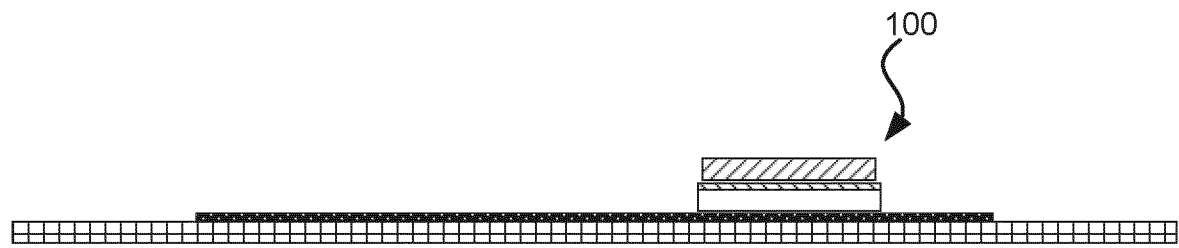
Figure 8:
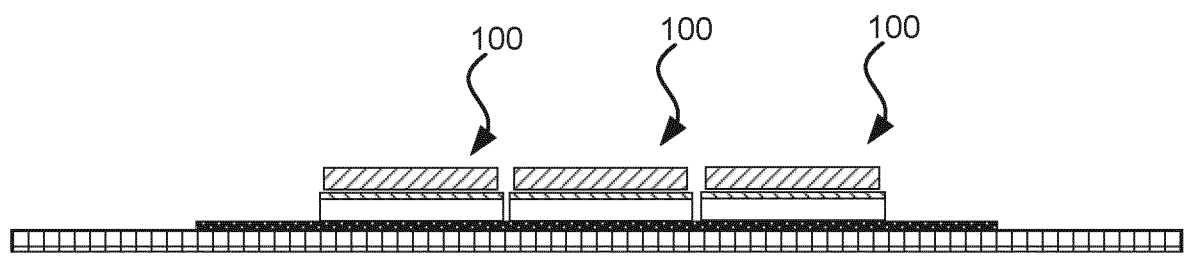

FIGS. 6, 7, 8 illustrate a schematic representation of a cross section side view of a manufacturing process for attaching tiles 100 onto the bias plate 106 according to an embodiment. Tiles 100 may be attached onto the bias plate 106 by inserting the direct conversion compound semiconductor sensor 101 onto the bias plate 106. Tiles 100 may be placed next to each other with an appropriate gap between the tiles 100. The height difference in the z-axis direction may be very small with respect to different tiles when they are assembled resting on the bias plate 106. Planarity issues may be consequently avoided. The sensor 101 contacts the bias plate 106. The bias plate 106 may be configured as the high-voltage bias for the sensor 101. Furthermore, the bias plate 106 conducts heat away from the tiles 100.

Figure 9:
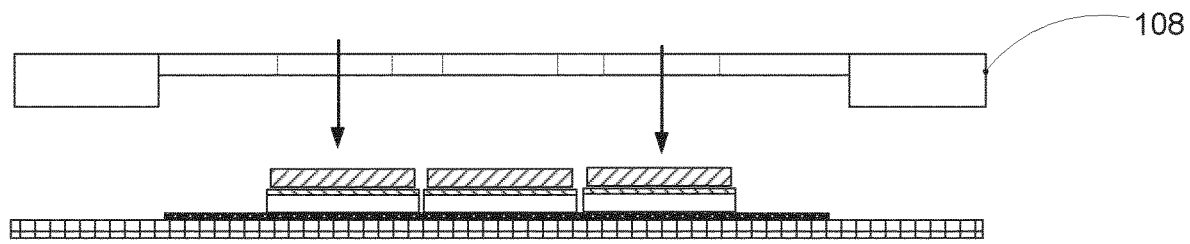
FIG. 9 illustrates a schematic representation of a cross section side view of a tile support plate attachment in the manufacturing process according to an embodiment.

FIG. 9 illustrates a schematic representation of a cross section side view of a tile support plate 108 attachment in the manufacturing process according to an embodiment. The tile support plate 108 is attached onto the tiles 100 at the center and onto the entry window 105 at sides. The tile support plate 108 may contact the substrate 103 and the window 105. The tile support plate 108 is configured to encapsulate the array of tiles 100, at least by the cross section. Consequently, it may protect the array and also effectively conduct heat away from the tiles 100.

Figure 10:
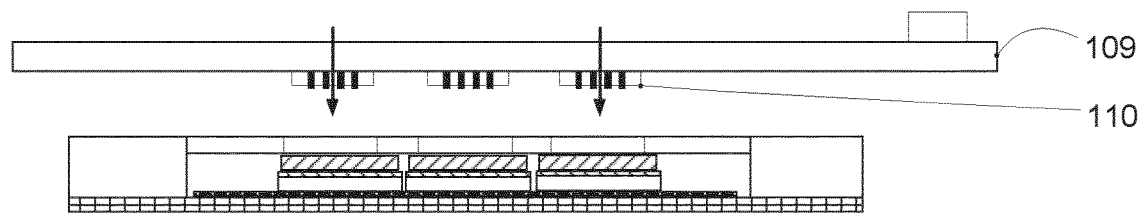
FIG. 10 illustrates a schematic representation of a cross section side view of an interconnection board attachment in the manufacturing process according to an embodiment.

FIG. 10 illustrates a schematic representation of a cross section side view of an interconnection board 109 attachment in the manufacturing process according to an embodiment. The interconnection board 109 is attached onto the top of the tile support plate 108. The interconnection board 109 comprises spring load connectors 110 which enter into recesses of the tile support plate 109. They connect to the I/O pad connectors 104 of the substrate 103 and are elastically forced by the spring so as to maintain and secure electrical connection.

Figure 11:
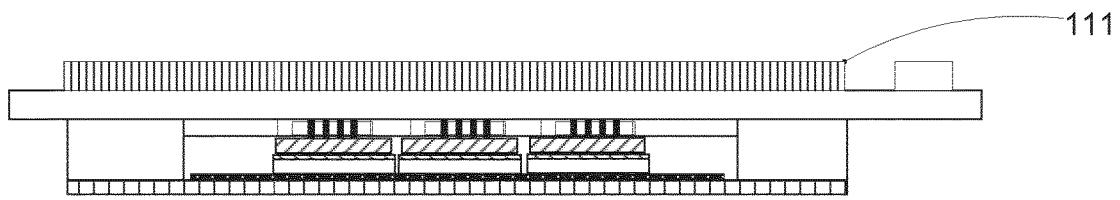
FIG. 11 illustrates a schematic representation of a cross section side view of a panel support attachment in the manufacturing process according to an embodiment.

FIG. 11 illustrates a schematic representation of a cross section side view of a panel support 111 attachment in the manufacturing process according to an embodiment. The panel support 111 is attached onto the interconnection board 109. The panel support 111 is configured as a heat sink to effectively receive the heat from the tiles 200. Furthermore, it supports the sub-assembly 200 and establishes a base for the sub-assembly 200.

Figure 12:
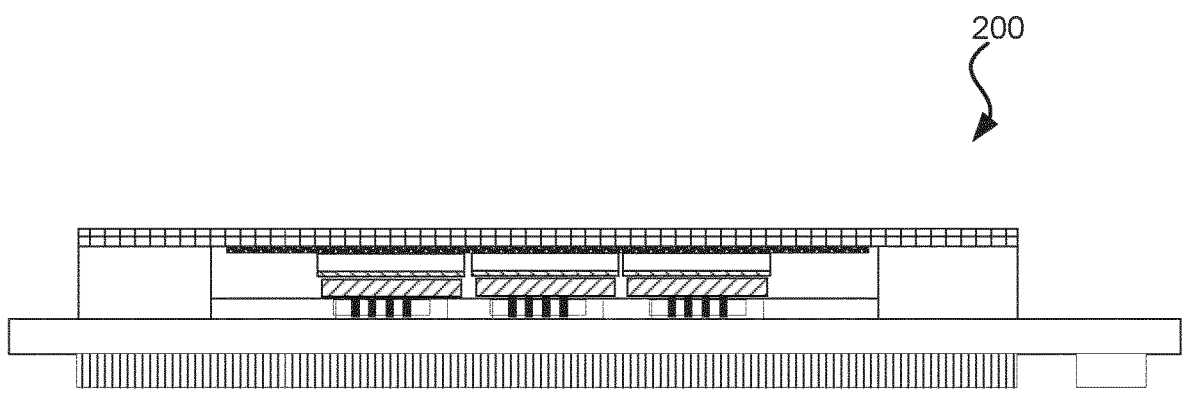
FIG. 12 illustrates a schematic representation of a cross section side view of a sub-assembly of a detector according to an embodiment.

FIG. 12 illustrates a schematic representation of a cross section side view of a sub-assembly 200 of a detector according to an embodiment. In the last operation performed on the sub-assembly 200 it is flipped over as shown in FIG. 12 with respect to FIG. 11, for example correspondingly to what is illustrated in FIG. 4.

Typically, the detector is manufactured so that tiles are attached to the support frame and rest on it. In the embodiments, this is made upside down so that during manufacturing, the sensor 101 of the tile 100 rests on the bias plate 106 and the entrance window 105. Generally, the total height of the sensor tiles 100 may vary from part to part. When attaching the sensor tiles 100 to one plane formed by the X-ray entrance window surface, the front face of the tiles 100 is on the same general plane with a reasonable accuracy. According to an embodiment, the sensor tile-to-tile variation can be further compensated for by the spring load pins, for example by the spring load connectors 110.

The tile attachments can be automated by a die bonding machine.

According to an embodiment, in order to further benefit from the flipped sub-assembly concept, the tile 100' may be assembled without the tile substrate 103 as for example shown in the following figures.

Figure 13:
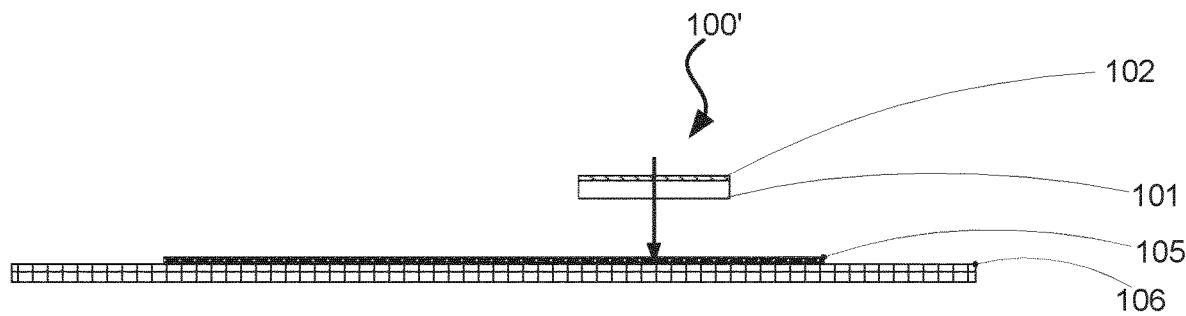
FIG. 13 illustrates a schematic representation of a cross section side view of attaching a substrate free tile in a manufacturing process of a sub-assembly according to an embodiment.
Figure 14:
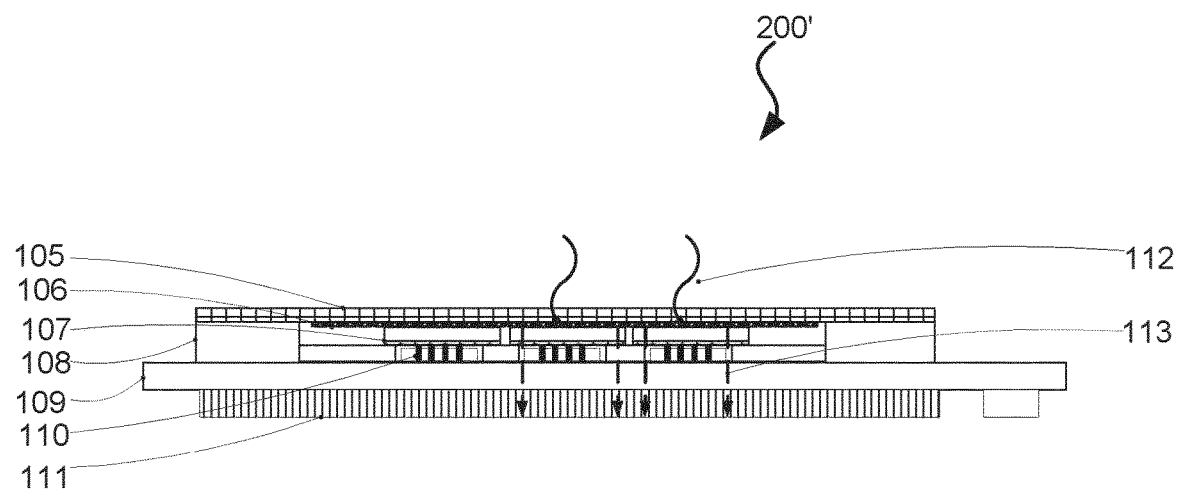
FIG. 14 illustrates a schematic representation of a cross section side view of a sub-assembly of a detector with substrate free tiles according to an embodiment.

FIG. 13 illustrates a schematic representation of a cross section side view of attaching a substrate free tile 100' in a manufacturing process of a sub-assembly 200' according to an embodiment. FIG. 14 illustrates a schematic representation of a cross section side view of a sub-assembly 200' of a detector with substrate free tiles 100' according to an embodiment.

Some parts of the tile substrate free panel sub-assembly 200' are shown in FIG. 14. The parts are the same as for example shown in the previous figures, except that the tile substrate 103 is removed. Since the sensor tiles 100' are assembled onto the radiation entrance window 105, the need for the substrate 103 can be eliminated. Consequently, the window 105 may act as a support. Removing of the tile substrate 103 may provide the following benefits. The need for an organic or inorganic substrate can be eliminated, which means cost reduction. The thermal heat transfer may also be improved by eliminating the ceramic substrate in between the readout IC 102 and the tile support plate 108.

Figure 15:
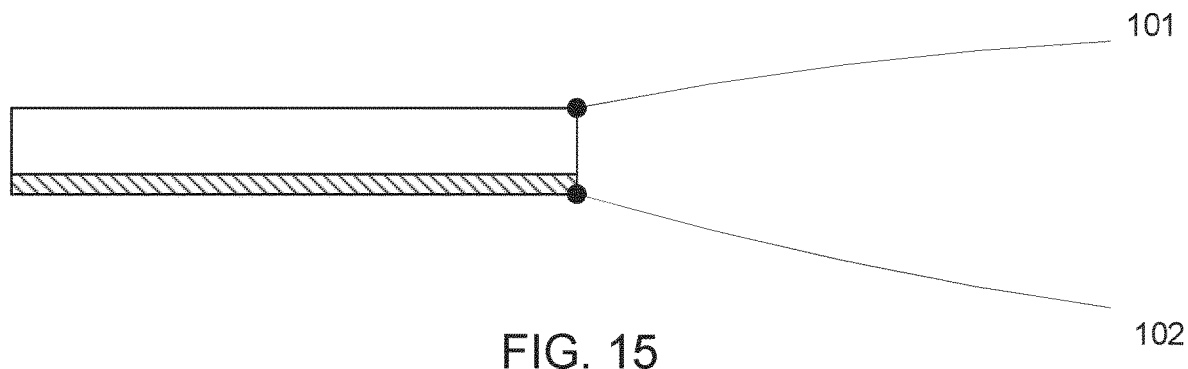
FIG. 15 illustrates a schematic representation of a cross section side view of a tile according to another embodiment.
Figure 16:
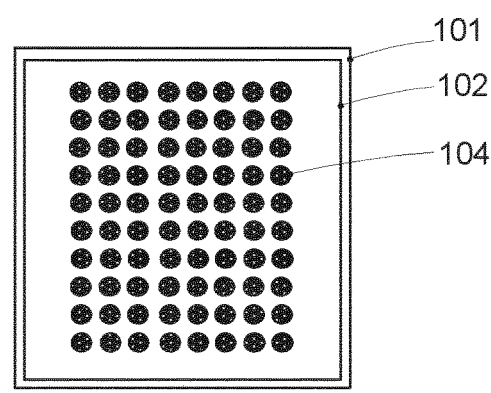
FIG. 16 illustrates a schematic representation of a bottom view of the tile according to the other embodiment.

FIG. 15 illustrates a schematic representation of a cross section side view of a tile 100' according to another embodiment. FIG. 16 illustrates a schematic representation of a bottom view of the tile 100'. In this embodiment, the use of the tile substrate 103 can be eliminated for example as follows. The sensor chip 101 is attached onto the readout IC 102, or vice versa, the readout IC 102 is attached onto the sensor chip 101. An interconnection to the sensor tile 100 is directly made into an I/O connection, which is located at a back-side of the readout IC 102 as shown in FIG. 16 having the I/O connection pads 104. Furthermore, the interconnection can be secured with a spring load connection such as using a pogo pin.

Figure 17:
FIG. 17 illustrates a schematic representation of a cross section side view of a bias plane and front substrate in a manufacturing process according to an embodiment.

FIG. 17 illustrates a schematic representation of a cross section side view of a bias plate 106 and a front substrate 105, which may be referred to as the radiation entrance window in a manufacturing process according to an embodiment. The embodiment of FIG. 17 is similar to the embodiment of FIG. 5.

Figure 18:
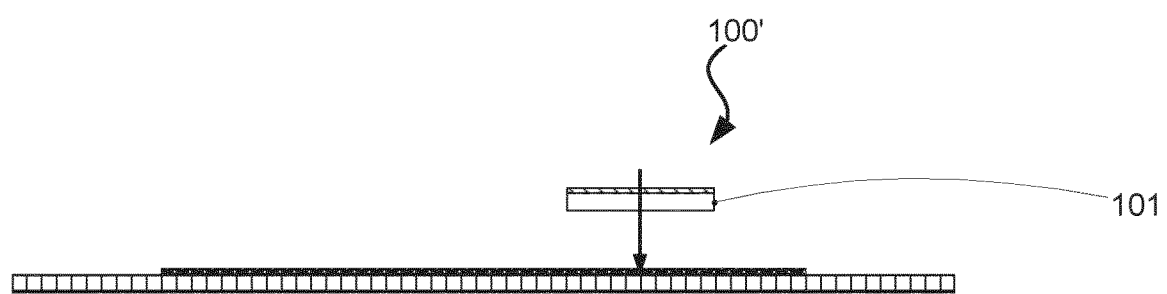
FIGS. 18, 19, 20 illustrate a schematic representation of a cross section side view of a manufacturing process for attaching tiles to a bias plate according to another embodiment.
Figure 19:
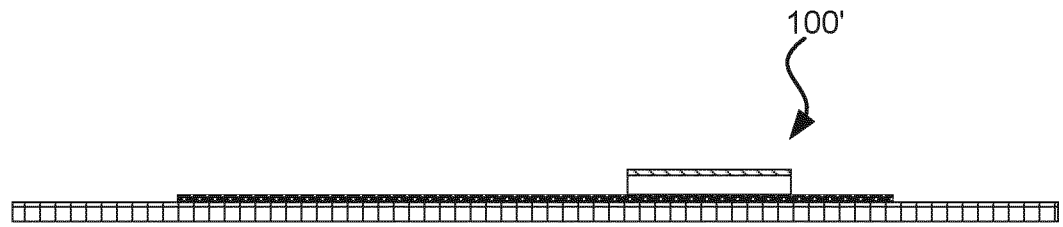
Figure 20:
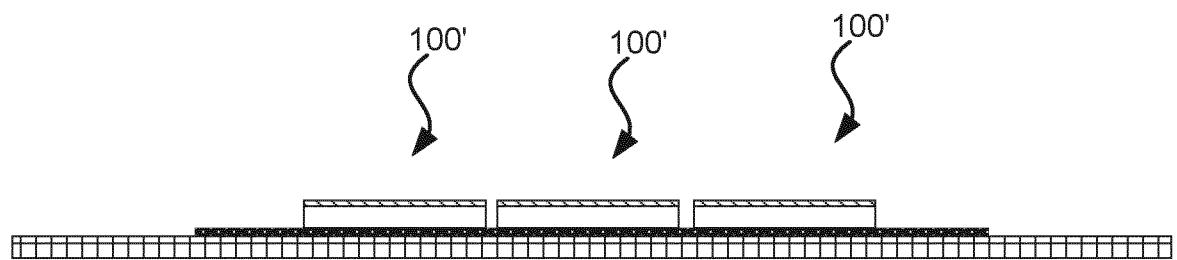

FIGS. 18, 19, 20 illustrate a schematic representation of a cross section side view of a manufacturing process for attaching tiles 100' to a bias plate 106 according to an embodiment. The embodiment of FIGS. 18-20 is similar to the embodiments of FIGS. 6-8, except for the tile 100' that does not require a substrate.

Figure 21:
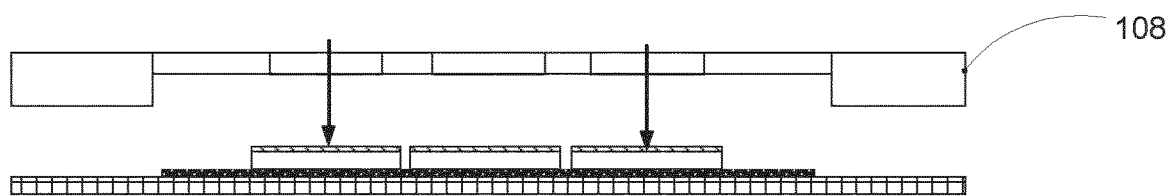
FIG. 21 illustrates a schematic representation of a cross section side view of tile support plate attachment in the manufacturing process according to an embodiment.

FIG. 21 illustrates a schematic representation of a cross section side view of tile support plate 108 attachment in the manufacturing process according to an embodiment. The embodiment of FIG. 21 is similar to the embodiment of FIG. 9, except for the tile 100'. Thermal heat transfer may be improved by eliminating the ceramic substrate in between the readout IC 102 and the tile support plate 108. The tile support plate 108 is also configured to support and secure the tile 100' without the substrate.

Figure 22:
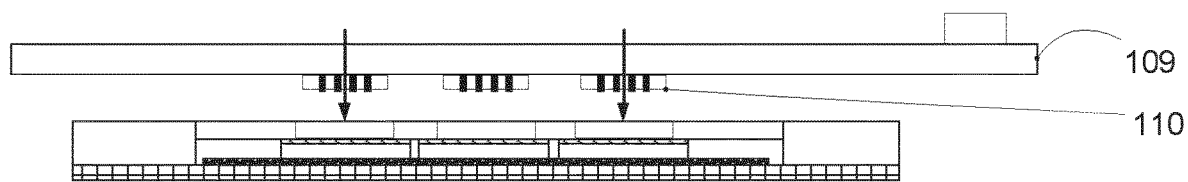
FIG. 22 illustrates a schematic representation of an interconnection board attachment in the manufacturing process according to another embodiment.

FIG. 22 illustrates a schematic representation of an interconnection board 109 attachment in the manufacturing process according to an embodiment. The embodiment of FIG. 22 is similar to the embodiment of FIG. 10, except for the tile 100'. The interconnection board 109 comprises the spring load connectors 110. The spring load connectors 110 connect to the tile 100'. The spring load connectors 110 are configured to directly contact the I/O connection pads 104 of the tile 100' at the backside of the readout IC 102. It may also act as a supporting member to the tile 100'.

Figure 23:
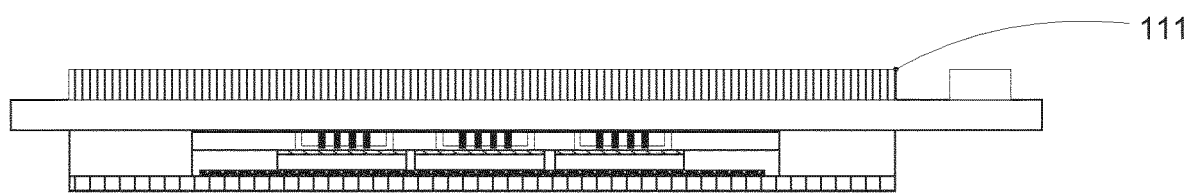
FIG. 23 illustrates a schematic representation of a panel support and heat sink attachment in the manufacturing process according to an embodiment.

FIG. 23 illustrates a schematic representation of a panel support 111 and heat sink attachment in the manufacturing process according to an embodiment. The embodiment is similar to the embodiment of FIG. 11.

Figure 24:
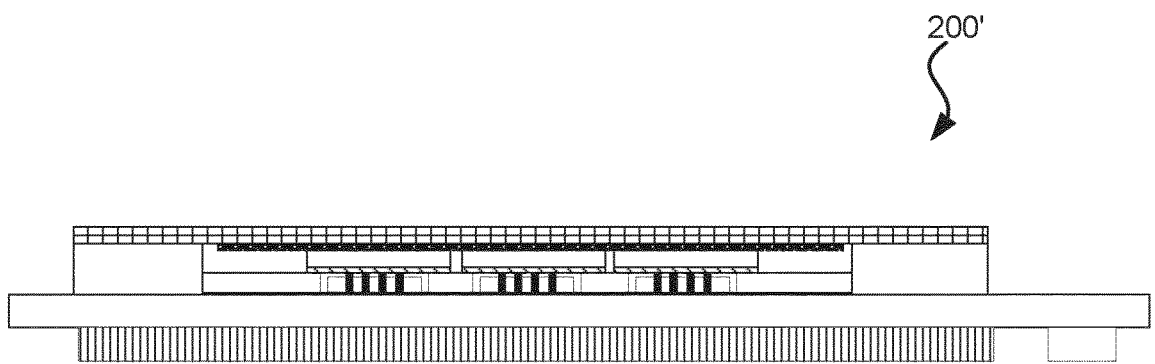
FIG. 24 illustrates a schematic representation of a cross section side view of a sub-assembly of a detector according to another embodiment.

FIG. 24 illustrates a schematic representation of a cross section side view of a sub-assembly 200' of a detector according to another embodiment having the tile 100' without the substrate.

Figure 25:
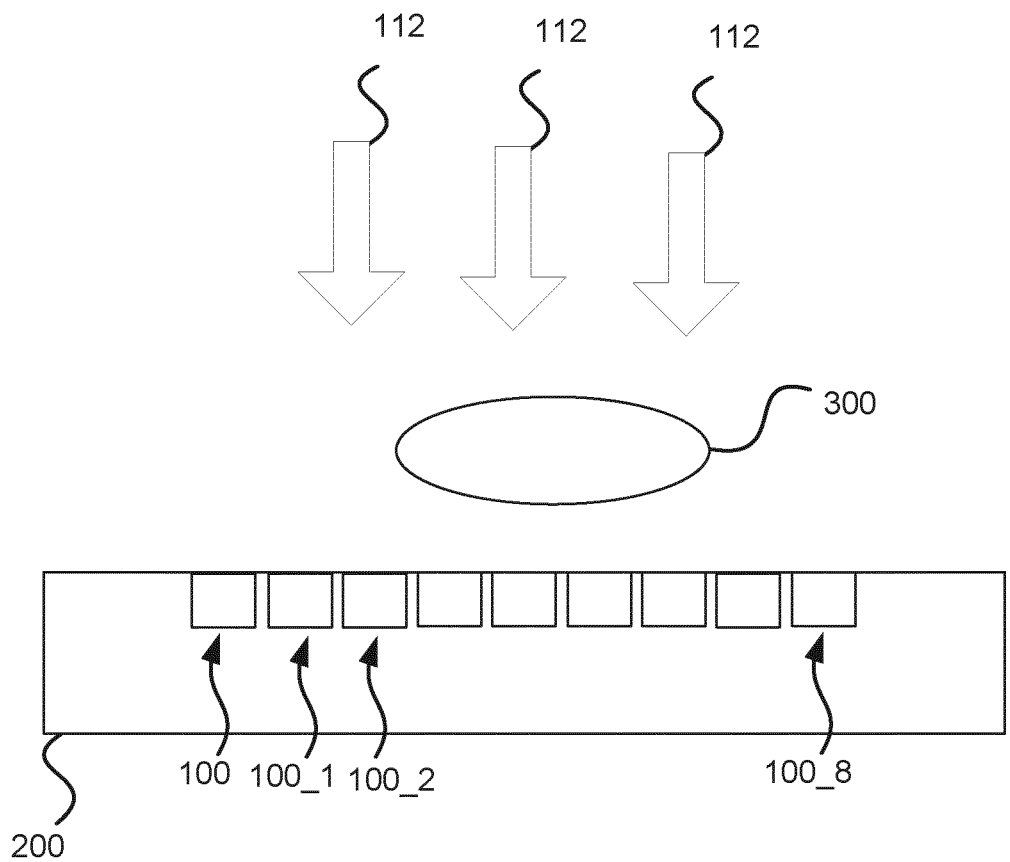
FIG. 25 illustrates a schematic representation of a cross section of a detector having the tiles according to an embodiment.

FIG. 25 illustrates a schematic representation of a cross section of a detector 200 having an array of tiles 100 according to an embodiment. X-ray radiation 112 is emitted from a source (not shown in FIG. 25). An object 300 to be detected and inspected by the x-ray radiation 112 is shown between the radiation source and the detector 200. The detector 200 comprises an array having nine tiles 100-100_8 in the cross section of the detector 200, for example in the x-axis direction.

FIG. 25 illustrates the detection devices 200 comprising tiles 100 that are manufactured by the process as described above. The sensor faces and rests on the bias plate of the entrance window. The sub-assembly so manufactured is flipped for being used as the detector. The device 200 may be a part of an imaging system for detecting the object 300, comprising the tiles 100,100' as described in any of these embodiments. The system may be applied for example in medical imaging, security imaging and/or industrial imaging.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

An embodiment relates to a method comprising: configuring a panel plate as an entrance window for high energy electromagnetic, for example x-ray or gamma ray, radiation; attaching a bias plate on the panel plate, wherein the bias plate is configured to conduct electricity and pass the radiation through it; and attaching an array of tiles, wherein each tile comprises a direct conversion compound semiconductor sensor and a readout integrated circuit, IC, layer on the bias plate so that the direct conversion compound semiconductor sensor is configured on the bias plate; wherein the direct conversion compound semiconductor sensor is configured to convert photons of the high energy electromagnetic, for example x-ray or gamma ray, radiation into an electric current; and wherein the readout IC layer is situated next to the direct conversion compound semiconductor sensor and configured to receive the electric current and process the electric current.

Alternatively or in addition to the above, the direct conversion compound semiconductor sensor rests directly on a surface of the bias plate during the operation of attaching. Alternatively or in addition to the above, further comprising turning over a sub-assembly comprising the attached panel plate, the attached bias plate and the attached array of the assemblies. Alternatively or in addition to the above, the bias plate comprises electrically conductive material to be configured as a high voltage bias for the direct conversion compound semiconductor sensor, and further comprises heat conductive material to be configured as a heat conductor for the tile. Alternatively or in addition to the above, the panel plate comprises electrically and thermally isolating material. Alternatively or in addition to the above, further comprising attaching an array support plate partly on the array and partly on the panel plate; wherein the array support plate is configured to encapsulate the array at least by a cross section. Alternatively or in addition to the above, further comprising attaching an interconnection board on the array support plate; wherein the interconnection board comprises elastically forced connectors that are configured to electrically contact the array for receiving the processed electric current from the readout IC and to output the received and processed electric current. Alternatively or in addition to the above, further comprising attaching a panel support plate on the interconnection board; wherein the panel support plate comprises heat conductive material. Alternatively or in addition to the above, the array of tiles is configured without a substrate. Alternatively or in addition to the above, the direct conversion compound semiconductor layer comprises cadmium telluride or cadmium zinc telluride.

According to an embodiment, a high frequency radiation detector, comprising: a direct conversion compound semiconductor sensor; a readout integrated circuit, IC, wherein the direct conversion compound semiconductor sensor is configured to convert photons of high energy electromagnetic, for example x-ray or gamma ray, radiation into an electric current; and wherein the readout IC layer is situated next to the direct conversion compound semiconductor sensor and configured to receive the electric current and process the electric current; assembled by: configuring a panel plate as an entrance window for the high energy electromagnetic, for example x-ray or gamma ray, radiation; attaching a bias plate on the panel plate, wherein the bias plate is configured to conduct electricity and pass the radiation through it; and attaching an array of tiles, wherein each tile comprises the direct conversion compound semiconductor sensor and the readout integrated circuit, IC, on the bias plate so that the direct conversion compound semiconductor sensor is configured on the bias plate.

According to an embodiment an imaging system, comprising: an x-ray source; the detector according to any preceding embodiment.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A manufacturing method, comprising:
    configuring a panel plate as an entrance window for x-ray or gamma ray radiation;
    attaching a bias plate on the panel plate with respect to a z-axis, wherein the bias plate is configured to conduct electricity and pass the radiation through it; characterized by
    attaching an array of tiles, wherein each tile comprises a direct conversion compound semiconductor sensor and a readout integrated circuit, IC, layer, on the bias plate with respect to the z-axis so that the direct conversion compound semiconductor sensor is configured on and in contact with the bias plate, wherein the direct conversion compound semiconductor sensor rests directly on a surface of the bias plate by inserting the direct conversion compound semiconductor sensor onto the bias plate, and wherein the tiles are placed next to each other with a gap between the tiles;
    wherein the direct conversion compound semiconductor sensor is configured to convert photons of the x-ray or gamma ray radiation into an electric current;
    wherein the readout IC layer is situated on an opposite side of the direct conversion compound semiconductor sensor from the bias plate and configured to receive the electric current and process the electric current; and
    turning over a sub-assembly with respect to the z-axis comprising the attached panel plate, the attached bias plate and the attached array of the assemblies so that IC layers of the tiles are lowest part and the panel plate is top part with respect to each other.

2. The method of claim 1, wherein the bias plate comprises electrically conductive material to be configured as a high voltage bias for the direct conversion compound semiconductor sensor, and further comprises heat conductive material to be configured as a heat conductor for the tile.

3. The method of claim 1, wherein the panel plate comprises electrically and thermally isolating material.

4. The method of claim 1, further comprising attaching an array support plate partly on the array and partly on the panel plate;
    wherein the array support plate is configured to encapsulate the array at least by a cross section.

5. The method of claim 4, further comprising attaching an interconnection board on the array support plate;
    wherein the interconnection board comprises elastically forced connectors that are configured to electrically contact the array for receiving the processed electric current from the readout IC and to output the received and processed electric current.

6. The method of claim 5, further comprising attaching a panel support plate on the interconnection board;
    wherein the panel support plate comprises heat conductive material.

7. The method of claim 1, wherein the array of tiles is configured without a substrate.

8. The method of claim 1, wherein the direct conversion compound semiconductor layer comprises cadmium telluride or cadmium zinc telluride.

* * * * *